(12) United States Patent
Miyoshi

(10) Patent No.: US 6,597,172 B2
(45) Date of Patent: Jul. 22, 2003

(54) WATER AND FAT SEPARATION IMAGE FORMING METHOD, MAGNETIC RESONANCE IMAGING APPARATUS, REFERENCE PEAK PHASE DETECTING METHOD AND REFERENCE PEAK POSITION DETECTING METHOD

(75) Inventor: Mitsuharu Miyoshi, Tokyo (JP)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 171 days.

(21) Appl. No.: 09/756,840

(22) Filed: Jan. 9, 2001

(65) Prior Publication Data

US 2001/0010810 A1 Aug. 2, 2001

(30) Foreign Application Priority Data

Jan. 27, 2000 (JP) ........................ 2000-019045

(51) Int. Cl.⁷ .............................................. G01R 33/20
(52) U.S. Cl. ..................... 324/307; 324/307; 324/309
(58) Field of Search ................. 324/309, 314, 324/311, 307; 702/106, 136; 600/410

(56) References Cited

U.S. PATENT DOCUMENTS

| | | | | |
|---|---|---|---|---|
| 4,949,042 A | * | 8/1990 | Kuhara et al. | 324/311 |
| 5,113,865 A | * | 5/1992 | Maeda et al. | 324/309 |
| 5,162,737 A | * | 11/1992 | Nozokido et al. | 324/309 |
| 5,309,102 A | | 5/1994 | Deckard | 324/307 |
| 5,485,085 A | | 1/1996 | Sumanaweera | 314/307 |
| 5,498,963 A | * | 3/1996 | Schneider et al. | 324/309 |
| 5,627,469 A | * | 5/1997 | Hong et al. | 324/309 |
| 6,150,814 A | * | 11/2000 | Redpath et al. | 324/307 |
| 6,177,795 B1 | * | 1/2001 | Zhu et al. | 324/307 |
| 6,263,228 B1 | * | 7/2001 | Zhang et al. | 600/409 |

FOREIGN PATENT DOCUMENTS

JP  2-21845  1/1990

OTHER PUBLICATIONS

Ahn "New phase correction method in NMR imaging based on autocorrelation histogram analysis" IEEE Trans. Medical Imaging, vol MI–6, No. 1 Mar. 1987.
Borello "Chemical shift–based true water and fat images, regional phase correction of modified spin echo MR images", Radiology, Aug. 1987, V.164, No. 2 pp. 531–537.
M Audlsey "Automatied processing for proton spectrosopic imaging using water reference deconvoluton" Magnetic Resonance in Medicine, US Academnic Press, vol. 32, No. 6, Jun. 1994, pp. 589–595.
Borello et al "Chemical shift–based true water and fat image; regional phase correction of modified spin ehco images" Radiology, The RAdiological society of North America, Aug. 1987; vol. 164, No. 2, pp. 531–537.

* cited by examiner

Primary Examiner—Marc S. Hoff
Assistant Examiner—Paul L Kim
(74) Attorney, Agent, or Firm—Moonray Kojima

(57) ABSTRACT

With an object of separately and preferably forming a water image and a fat image even when there are present a plurality of independent signal regions in a complex number image taken by utilizing magnetic resonance, a complex number image is taken by utilizing magnetic resonance to provide a phase difference between water and fat (J1), phases are respectively corrected in respective signal regions a plurality of which are present independently in the complex number image (J3), phase shifts among the respective signal regions are corrected (J4) and a water image and a fat image are separately formed from the complex number image by utilizing a phase difference between water and fat (J5).

16 Claims, 9 Drawing Sheets

Complex number image

Complex number image

Complex number image

Complex number image

Water image

Fat image

Phase distribution histogram of signal region S1

Phase distribution histogram of signal region S1

Phase distribution histogram of signal region S2

Phase distribution histogram of signal region S3

Phase distribution histogram of signal region S2 after phase shift correction

Phase distribution histogram of signal region S3 after phase shift correction

Phase distribution histogram shifted by $-\alpha$

Added histogram

WATER AND FAT SEPARATION IMAGE FORMING METHOD, MAGNETIC RESONANCE IMAGING APPARATUS, REFERENCE PEAK PHASE DETECTING METHOD AND REFERENCE PEAK POSITION DETECTING METHOD

BACKGROUND OF THE INVENTION

The present invention relates to a water and fat separation image forming method, a magnetic resonance imaging apparatus, a reference peak phase detecting method and a reference peak position detecting method. More in details, the present invention relates to a water and fat separation image forming method and a magnetic resonance imaging apparatus capable of separately and preferably forming a water image and a fat image even in the case in which a plurality of independent signal regions are present in a complex number image taken by utilizing magnetic resonance. Further, the present invention relates to a reference peak phase detecting method and a reference peak position detecting method capable of simply detecting a phase or a position of a reference peak in a distribution satisfying a specific condition.

There is disclosed a water and fat separation image forming method for taking a complex number image by utilizing magnetic resonance to provide a phase difference between water and fat and separately forming a water image and a fat image from the complex number image by utilizing the phase difference between water and fat in, for example, "SMRM85vol. 1 pp. 172–173: Zvi Paltiel, Amir Ban (Elscient MRI Center)".

FIG. 1 shows a flow of a conventional water and fat separation image forming method.

At step J1, an image is taken by utilizing magnetic resonance to provide a phase difference between water and fat and form a complex number image.

At step J3', a phase error caused by a non-uniformity of a magnetic field is corrected.

At step J5', a water image and fat image are separately formed by utilizing the phase difference between water and fat from the complex number image the phase of which has been corrected.

According to the conventional water and fat separation image forming method, as shown in FIG. 2, when there is only one signal region N in the complex number image (that is, when the signal region S is not divided by a noise region N), the water image and fat image can properly be formed to separate from each other.

However, when there are a plurality of signal regions S1 through S3 in the complex number image as shown by FIG. 3, (that is, the signal regions S1 through S3 are divided by a noise region N2), there poses a problem in which the water image and the fat image cannot properly be formed to separate from each other.

SUMMARY OF THE INVENTION

It is a first object of the present invention to provide a water and fat separation image forming method and a magnetic resonance imaging apparatus capable of separately and preferably forming a water image and a fat image even in the case in which there are present a plurality of independent signal regions in a complex number image taken by utilizing magnetic resonance.

Further, it is a second object of the present invention to provide a reference peak phase detecting method which is a method capable of being utilized in implementing the water and fat separation image forming method and the magnetic resonance imaging apparatus according to the first object and which can simply detect a phase of a reference peak in a distribution satisfying a specific condition.

Further, it is a third object of the present invention to provide a reference peak position detecting method which is a method generalizing the reference peak phase detecting method according to the second object and which can simply detect a position of a reference peak in a distribution satisfying a specific condition.

According to a first aspect of the present invention, there is provided a water and fat separation image forming method characterized in a water and fat separation image forming method for taking a complex number image by utilizing magnetic resonance to provide a phase difference between water and fat and separately forming a water image and a fat image from the complex number image by utilizing the phase difference between water and fat, wherein when there are present a plurality of independent signal regions in the complex number image, phases are respectively corrected in the respective signal regions, phase shifts among the respective signal regions are corrected, and then, the water image and the fat image are separately formed from the complex number image by utilizing the phase difference between water and fat.

When there are a plurality of signal regions in a complex number image, the reason that a water image and a fat image cannot properly be formed to separate is that phase shifts are present among the plurality of signal regions. That is, in one signal region, phase error caused by a non-uniformity in a magnetic field is continuous and therefore, phase of water in the signal region can be aligned by phase correction, further, phase of fat can also be aligned. Therefore, in the case of a single signal region, the water image and fat image can properly be formed to separate. However, when a signal region and another signal region are divided by a noise region, a phase error caused by a non-uniformity in a magnetic field in one signal region and a phase error caused by a non-uniformity in a magnetic field in other signal region, become discontinuous and therefore, although the phase of water can be aligned in the respective signal region, the phase of water cannot be aligned among the signal regions, further, although the phase of fat can be aligned in the respective signal region, the phase of fact cannot be aligned among the signal regions. Therefore, when there are a plurality of signal regions, the water image and the fat image cannot be properly formed to separate.

Hence, according to the first aspect of the water and fat separation image forming method, the phase correction is respectively carried out in the respective signal regions, thereafter, the phase shifts among the respective signal regions are corrected and thereafter, the water image and the fat image are separately formed by utilizing the phase difference between water and fat. By correction of the phase shift, the phase of water can be aligned in all of the signal regions, further, the phase of fat can also be aligned. Therefore, even when there are present the plurality of signal regions, the water image and the fat image can properly be formed to separate.

According to a second aspect of the present invention, there is provided the water and fat separation image forming method according to the first aspect, wherein in correcting the phase shifts, reference peak phases are respectively detected with respect to distributions of pixel numbers with regard to the phases of the respective signal regions subjected to the phase correction and the distributions of the pixel numbers with regard to the phases of the respective signal regions are shifted such that the reference peak phases coincide with each other.

Taking a distribution of a pixel number with respect to a phase in a respective signal region subjected to phase correction, the pixel number becomes a peak at a phase of water and a phase of fat.

Therefore, according to a second aspect of the water and fat separation image forming method, for example, as reference peak phases, phases of peaks of water are detected and distributions of the pixel numbers with respect to the phases of the respective signal regions are shifted such that the peak phases of water in the respective signal regions coincide with each other. Thereby, the phase of water can be aligned in all of the signal regions, further, the phase of fat can also be aligned. Therefore, even when there are present the plurality of signal regions, the water image and the fat image can properly be formed to separated.

According to a third aspect of the present invention, there is provided a magnetic resonance imaging apparatus characterized in comprising imaging means for taking a complex number image by utilizing magnetic resonance to provide a phase difference between water and fat, phase correcting means for respectively carrying out phase correction in respective signal regions when there are present a plurality of the independent signal regions in the complex number image, phase shift correcting means for correcting phase shifts among the respective signal regions subjected to the phase correction and image forming means for separately forming a water image and a fat image by utilizing the phase difference between water and fat from the complex number image corrected with the phase shifts.

According to the third aspect of the magnetic resonance imaging apparatus, the water and fat separation image forming method according to the first aspect can preferably be implemented.

According to a fourth aspect of the present invention, there is provided the magnetic resonance imaging apparatus according to the third aspect, characterized in that the phase difference between water and fat is not $\pi$, and wherein the phase shift correcting means comprises phase distribution forming means for forming distributions of pixel numbers with regard to phases at the respective signal regions subjected to phase correction, added distribution forming means for respectively calculating added distributions by shifting the phase distributions inversely by the phase difference and adding the shifted respective phase distributions to original phase distributions, reference peak phase determining means for calculating phases constituting maximum values of the pixel numbers in the respective added distributions and determining the phases as reference peak phases in original phase distributions and phase distribution shifting means for shifting the phase distributions in the respective signal regions such that the respective reference peak phases coincide with each other.

Taking a distribution of a pixel number with respect to the phase in the respective signal region subjected to phase correction, the pixel number is to constitute a peak at a phase of water and a phase of fat. However, in actually measured data, there are present a number of peaks, there emerges a peak larger than a peak in the phase of water or the phase of fat, a top portion of a peak is flat. It is not easy to determine which is the peak of water or which is the peak of fat. That is, it is not easy to calculate phase shifts among the signal regions.

Hence, according to the fourth aspect of the magnetic resonance imaging apparatus, the respective phase distribution subjected to the phase correction is shifted inversely by a phase difference between water and fat and added to the original phase distribution to thereby respectively calculate the added distribution. Thereby, in the respective added distribution, the peak of water and the peak of fat overlap at one location. A probability of constituting a maximum peak by the one overlapped portion is extremely high. Therefore, when a phase constituting a maximum value of the pixel number is calculated, the phase is the phase of water or the phase of fat (either of them may constitute a reference), the reference peak phase in the original phase distribution can easily be calculated. Further, the phase shifts among the respective signal regions can easily be calculated as differences among the reference peak phases of the respective signal regions. When the phase distributions of the respective signal regions are shifted to coincide these, the phase shifts among the respective signal regions can be corrected.

Further, the reason that the phase difference between water and fat is not $\pi$, is that when the phase difference is, the peak of water and the peak of fat cannot be discriminated from each other.

According to a fifth aspect of the present invention, there is provided a reference peak phase detecting method characterized in that when there is a phase distribution including a reference peak constituting a first maximum value of a value Y in a distribution of the value Y with respect to a phase $\theta$ and a referred peak constituting a second maximum value of the value Y at a phase at which the phase $\theta$ differs from the reference peak by $\alpha$ ($\alpha$ is not equal to $\pi$), the phase distribution is shifted inversely by $\alpha$ and added to an original phase distribution to thereby calculate an added distribution, a phase $\theta$ max constituting a maximum value of the Y in the added distribution is calculated and the phase $\theta$ max is determined as a phase of the reference peak in the original phase distribution.

The fifth aspect of the reference peak phase detecting method, is a method of simply detecting a phase of a reference peak when there is a phase distribution including a reference peak constituting a first maximum value of a value Y in a distribution of the value Y with respect to a phase $\theta$ (the value Y may be any value) and a referred peak constituting a second maximum value of the value Y at a phase at which the phase $\theta$ differs from the reference peak by $\alpha$ ($\alpha$ is not $\pi$).

That is, in the actually measured data of the distribution of the value Y with respect to the phase $\theta$, a number of peaks are present, a peak larger than the reference peak or the referred peak emerges, a top portion of a peak is flat. Accordingly, it is not easy to determine which is the reference peak.

Hence, according to the fifth aspect of the reference peak phase detecting method, the phase distribution is shifted inversely by a phase difference between the reference peak and the referred peak and added to the original phase distribution to thereby calculate the added distribution. Thereby, according to the added distribution, the reference peak and the referred peak overlap at one location. A probability of constituting a maximum peak at the one overlap location is extremely high. Therefore, when a phase constituting the maximum value of the pixel number is calculated in the added distribution, the phase is the phase of the reference peak and the reference peak phase in the original phase distribution can easily be detected.

Further, the reason that the phase difference between the reference peak and the referred peak is not $\pi$, is that when the phase difference is π, the reference peak and the referred peak cannot be discriminated from each other.

According to a sixth aspect of the present invention, there is provided a reference peak position detecting method characterized in that when there is an XY distribution including a reference peak constituting a first maximum value of a value Y in a distribution of the value Y with respect to a position X and a referred peak constituting a second maximum value of the value Y at a position at which the position X differs from the reference peak by A, the XY distribution is shifted inversely by A and added to an original XY distribution to thereby calculate an added distribution, a position Xmax constituting a maximum value of the value Y in the added distribution is calculated and the position Xmax is determined as a position of the reference peak in the original XY distribution.

The reference peak position detecting method according to the sixth aspect is a method of simply detecting a position of a reference peak when there is a position distribution including a reference peak constituting a first maximum value of a value Y in a distribution of the value Y (the value Y may be any value) with respect to a position X (position X may be any value, for example, may be a phase, may be a frequency or may be a distance) and a referred peak constituting a second maximum value of the value Y at a position at which the position X differs from the reference peak by A.

That is, in the actually measured data of the distribution of the value Y with respect to the position X, a number of peaks are present, a peak larger than the reference peak or the referred peak emerges, a top portion of a peak is flat. Accordingly, it is not easy to determine which is the reference peak.

Hence, according to the sixth aspect of the reference peak position detecting method, the position distribution is shifted inversely by a position difference between the reference peak and there referred peak and added to the original position distribution to thereby calculate the added distribution. Thereby, according to the added distribution, the reference peak and the referred peak overlap at one location. A probability of constituting a maximum peak at the one overlapped location is extremely high. Therefore, when a position of constituting the maximum value of the pixel number is calculated in the added distribution, the position is the position of the reference peak and the reference peak position in the original position distribution can easily be detected.

According to the water and fat separation image forming method and the magnetic resonance imaging apparatus of the invention, even in the case in which a plurality of independent signal regions are present in a complex number image taken by utilizing magnetic resonance, a water image and a fat image can be formed separately and preferably.

According to the reference peak phase detecting method and the reference peak position detecting method of the invention, a phase or a position of a reference peak in a distribution satisfying a specific condition can easily be detected.

Further objects and advantages of the present invention will be apparent from the following description of the preferred embodiments of the invention as illustrated in the accompanying drawings.

DETAILED DESCRIPTION OF THE INVENTION

Figure 1:
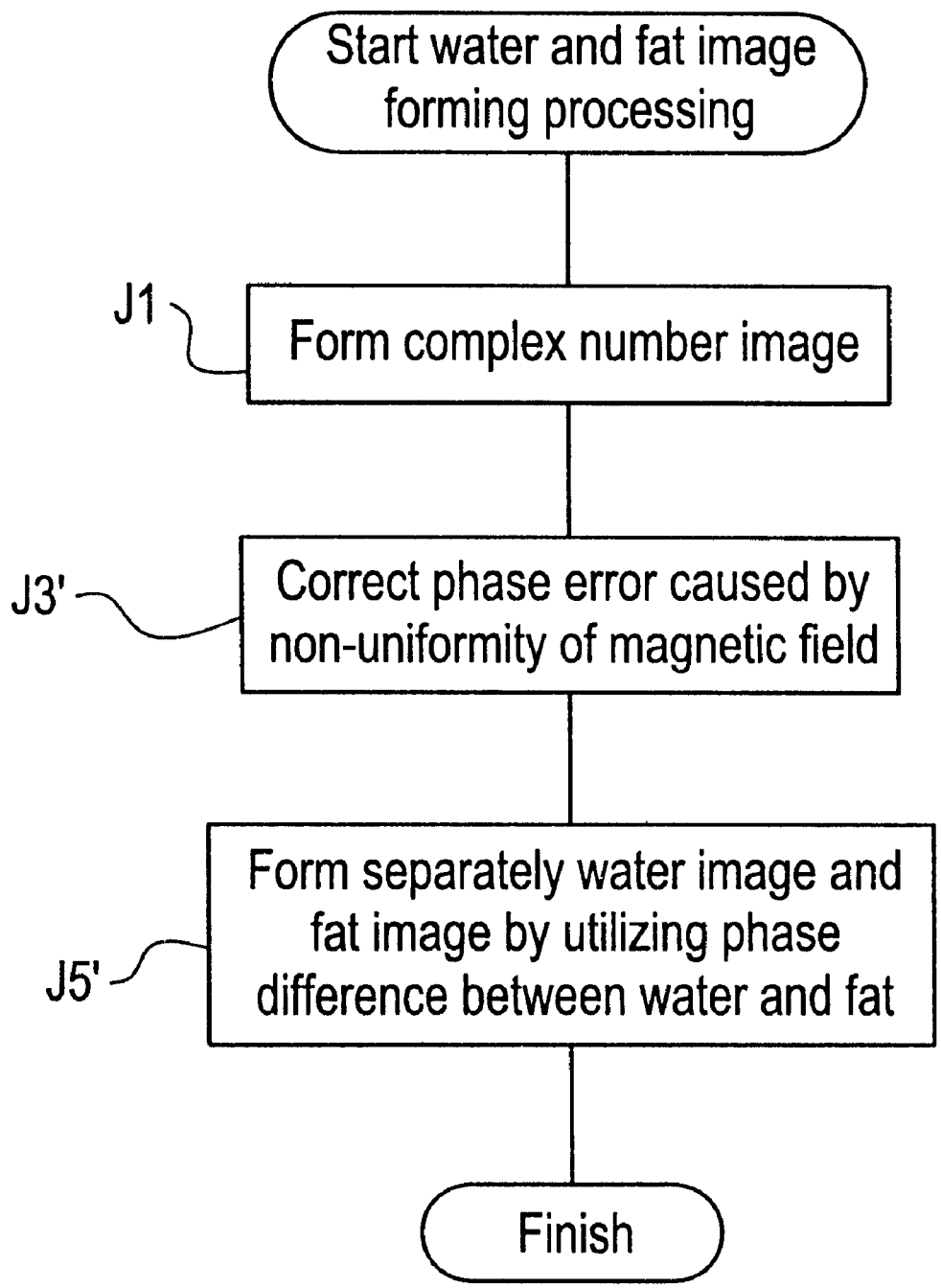
FIG. 1 is a flowchart showing a water and fat separation image forming processing by a conventional magnetic resonance imaging apparatus.
Figure 2:
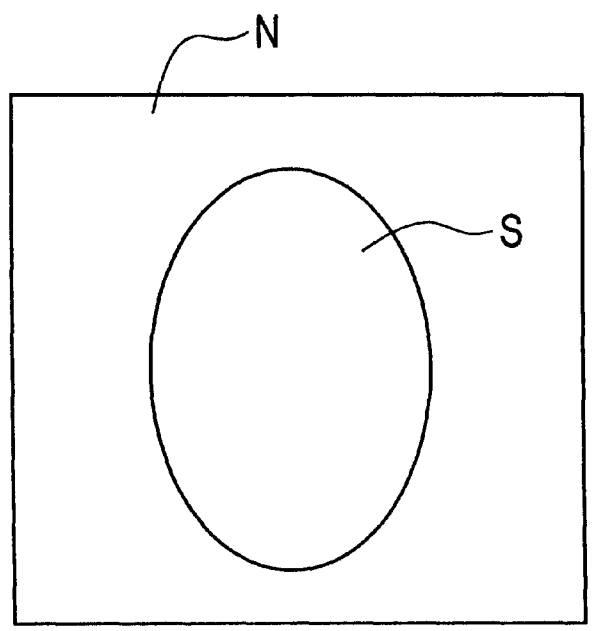
FIG. 2 is a view exemplifying a complex number image having only a single signal region.

A further detailed explanation will be given of the present invention by embodiments shown in the drawings as follows.

Figure 4:
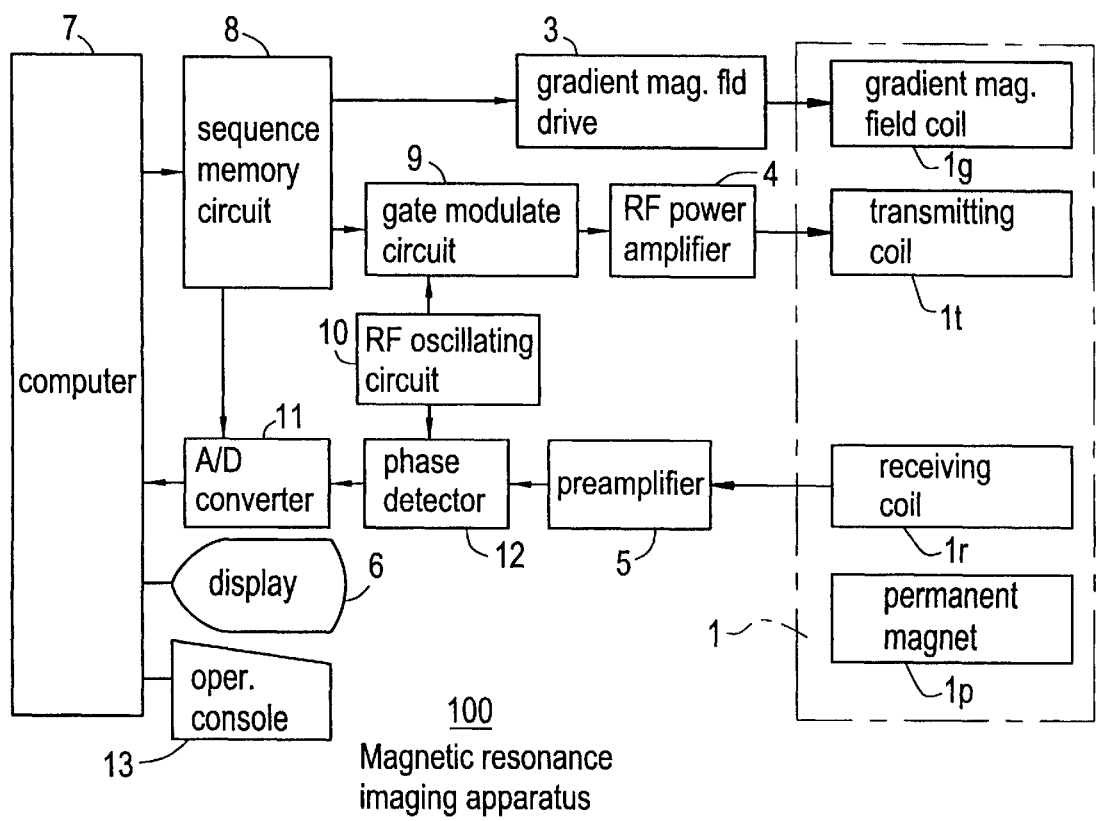
FIG. 4 is a block diagram showing a magnetic resonance imaging apparatus according to an embodiment of the present invention.

FIG. 4 is a block diagram showing a magnetic resonance imaging apparatus according to an embodiment of the present invention.

In the magnetic resonance imaging apparatus 100, a magnetic assembly 1 is provided with a space portion (hole) for inserting an object to be detected at an inner portion thereof and is arranged with a permanent magnet 1p for applying a constant main magnetic field to the object to be detected, a gradient magnetic field coil 1g for generating gradient magnetic fields in X-axis, Y-axis and Z-axis, a transmitting coil 1t for providing RF pulses exciting spin of atomic nucleus in the object to the detected and a receiving coil 1r for detecting an NMR signal from the object to be detected to surround the space portion. The gradient magnetic coil 1g, the transmitting coil 1t and the receiving coil 1r are respectively connected to a gradient magnetic field driving circuit 3, an RF power amplifier 4 and a preamplifier 5.

In accordance with instruction from a computer 7, a sequence memory circuit 8 operates the gradient magnetic field driving circuit 3 based on a stored pulse sequence, generates the gradient magnetic fields from the gradient magnetic field coil 1g of the magnet assembly 1, operates a gate modulating circuit 9, modulates a carrier output signal from an RF oscillating circuit 10 into a pulse-like signal at a predetermined timing and in a predetermined envelope shape, provides the modulated signal to the RF power amplifier 4 as an RF pulse, power-amplifies the modulated signal by the RF power amplifier 4 and thereafter, applies the amplified signal to the transmitting coil 1t of the magnet assembly 1 to thereby selectively excite a desired slice region or selectively excite a desired region of interest.

The preamplifier 5 amplifies an NMR signal from the object to be detected which has been detected by the receiving coil 1r of the magnet assembly 1 and inputs the NMR signal to a phase detector. The phase detector 12 subjects the NMR signal from the preamplifier 5 to phase detection and provides the signal to an A/D converter 11 with the carrier output signal of the RF oscillating circuit 10 as a reference signal. The A/D converter 11 converts an analog signal subjected to the phase detection into digital data and inputs the digital data to the computer 7.

The computer 7 reads the digital data from the A/D converter 11, carries out an image reconstitution operation and forms a complex number image, a water image, a fat image or the like in the slice region. Further, the computer 7 is assigned with overall control such as receiving information inputted from an operation console 13 or the like.

The complex number image, the water image, the fat image or the like is displayed by a display apparatus 6.

Figure 5:
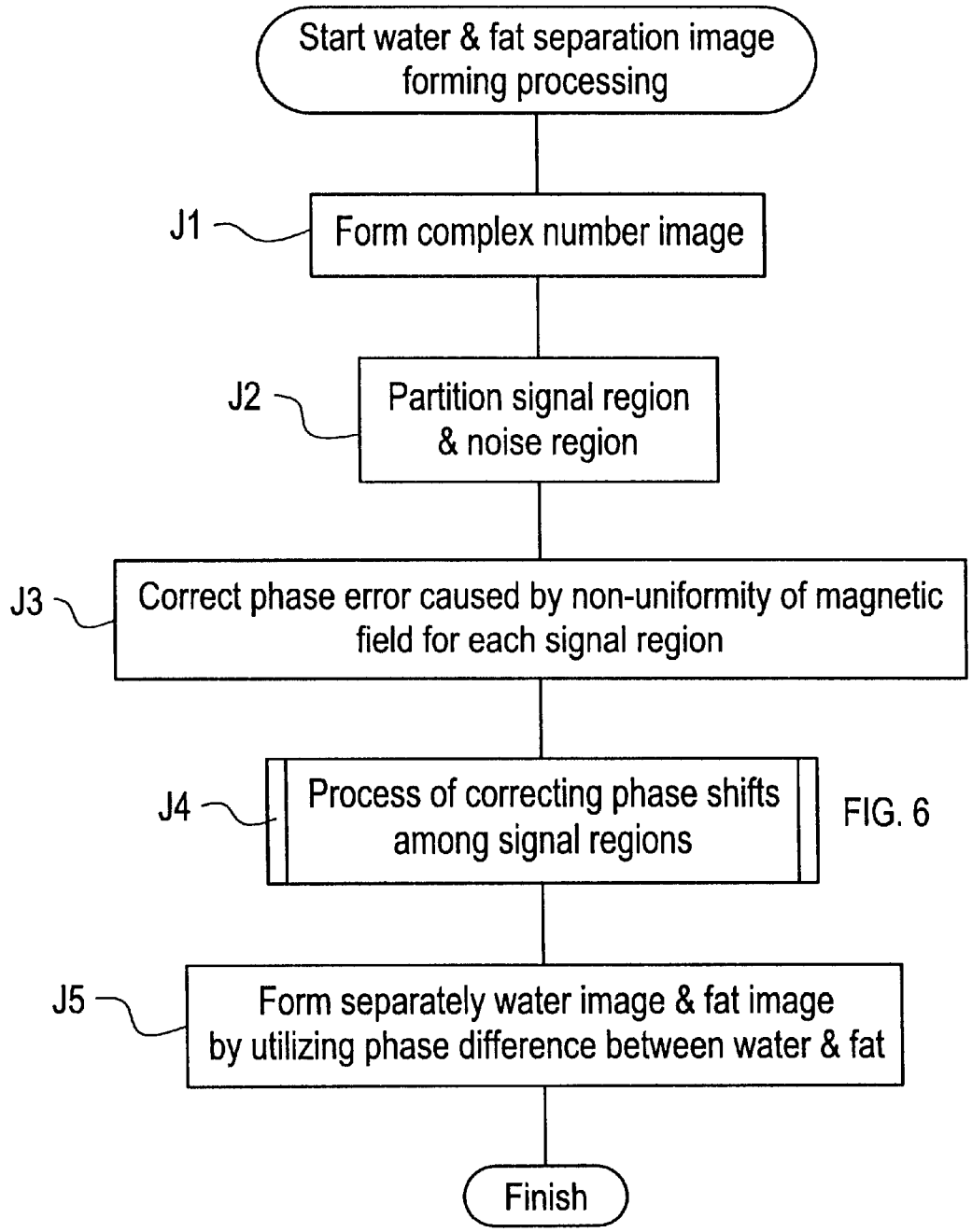
FIG. 5 is a flowchart showing a water and fat separation image forming processing by the magnetic resonance imaging apparatus of FIG. 4.

FIG. 5 is a flowchart showing a water and fat separation image forming process by the above-described magnetic resonance imaging apparatus 100.

At step J1, an image is taken by utilizing magnetic resonance to provide a phase difference α between water and fat to thereby form a complex number image. As a method of taking an image thereof, there can be utilized a method described in, for example, "SMRM85 vol. 1 pp. 172–173: Zvi Paltiel, Amir Ban (Elscient MRI Center)" or Japanese Unexamined Patent Publication No. 177658/1999.

At step J2, a signal region and a noise region are partitioned by utilizing, for example, a publicly-known method referred to as "first in first out".

An explanation will be given of the partition method in reference to FIG. 8 and FIG. 9.

Figure 8:
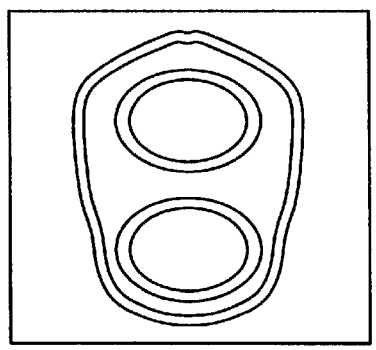
FIG. 8 is a view exemplifying a complex number image.

Based on a dispersion of noise in a complex number image shown in FIG. 8, a threshold of a signal region and a noise region is previously determined. Further, attention is paid to one point on the complex number image, a pixel value at the point and the threshold are compared and it is determined whether the point is a point in the signal region or a point in the noise region.

When the point is a point in the signal region, the point is made to constitute a signal region start point, it is determined whether contiguous four points are points in the signal region, when there is a point in the signal region in the contiguous four points, the point is made to constitute a successive signal region start point. When the successive signal region start point is determined, operation the same as described above is repeated. Further, when the contiguous four points are points in the noise region or points which have been made to constitute signal region start points previously, the repeating operation is stopped. Thereby, a region constituted by signal region start points from an initial signal region start point to a final signal region start point, constitutes one continuous signal region.

When a point in the complex number image is a point in the noise region, the point is made to constitute a noise region start point, it is determined whether contiguous four points are points in the noise region, when there is a point in the noise region in the contiguous four points, the point is made to constitute a successive noise region start point. When the successive noise region start point is determined, operation the same as described above is repeated. Further, when the contiguous four points are points in the signal region or points which have been made to constitute points in the noise region previously, the repeating operation is stopped. Thereby, a region constituted by noise region start points from an initial noise region start point to a final noise region start point, constitutes one continuous noise region.

Figure 9:
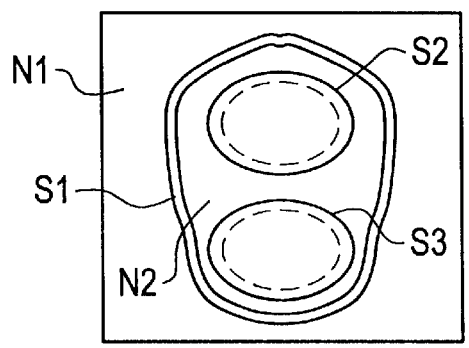
FIG. 9 is a view exemplifying a signal region and a noise region.

When the above-described operation is repeated until there are present no points the region of which has not been determined yet, as shown by FIG. 9, signal regions S1 through S3 and noise regions N1 and N2 can be partitioned.

Referring back to FIG. 5, at step J3, a phase error caused by a non-uniformity in the magnetic field is corrected for respective signal regions (S1, S2, S3 in FIG. 9) by utilizing a publicly-known phase correcting method. Thereby, in the respective signal regions (S1, S2, S3 of FIG. 9), phase of water can be aligned, further, phase of fat can also be aligned. As a phase correcting method thereof, there can be utilized a method described in, for example, "SMRM85 vol. 1 pp. 172–173: Zvi Paltiel, Amir Ban (Elscient MRI Center)" or Japanese Unexamined Patent Application No. 177658/1999.

At step J4, there is carried out a processing of correcting phase shifts among signal regions to thereby correct the phase shifts among the respective signal regions (S1, S2, S3 of FIG. 9). Thereby, even among the respective signal regions (S1, S2, S3 of FIG. 9), phase of water can be aligned, further, phase of fat can also be aligned.

Further, a detailed explanation will be given later of the processing of correcting the phase shifts among the signal regions in reference to FIG. 6.

At step J5, a water image and a fat image are separately formed by utilizing a phase difference between water and fat from the complex number image which has been subjected to phase shift correction. Further, the processings are finished.

Figure 10A:
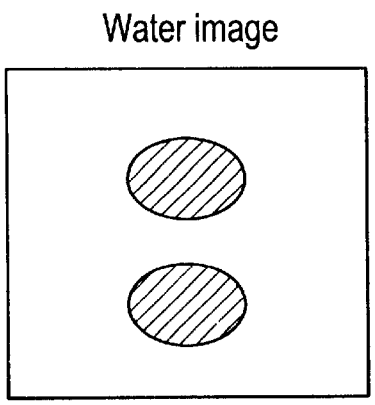
FIG. 10 illustrates views exemplifying a water image and a fat image.
Figure 10B:
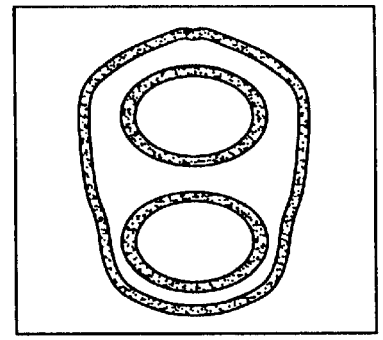

By the above-described, even in the case in which there are a plurality of signal regions, as shown by FIG. 10, a water image and a fat image can properly be formed to separate.

Figure 6:
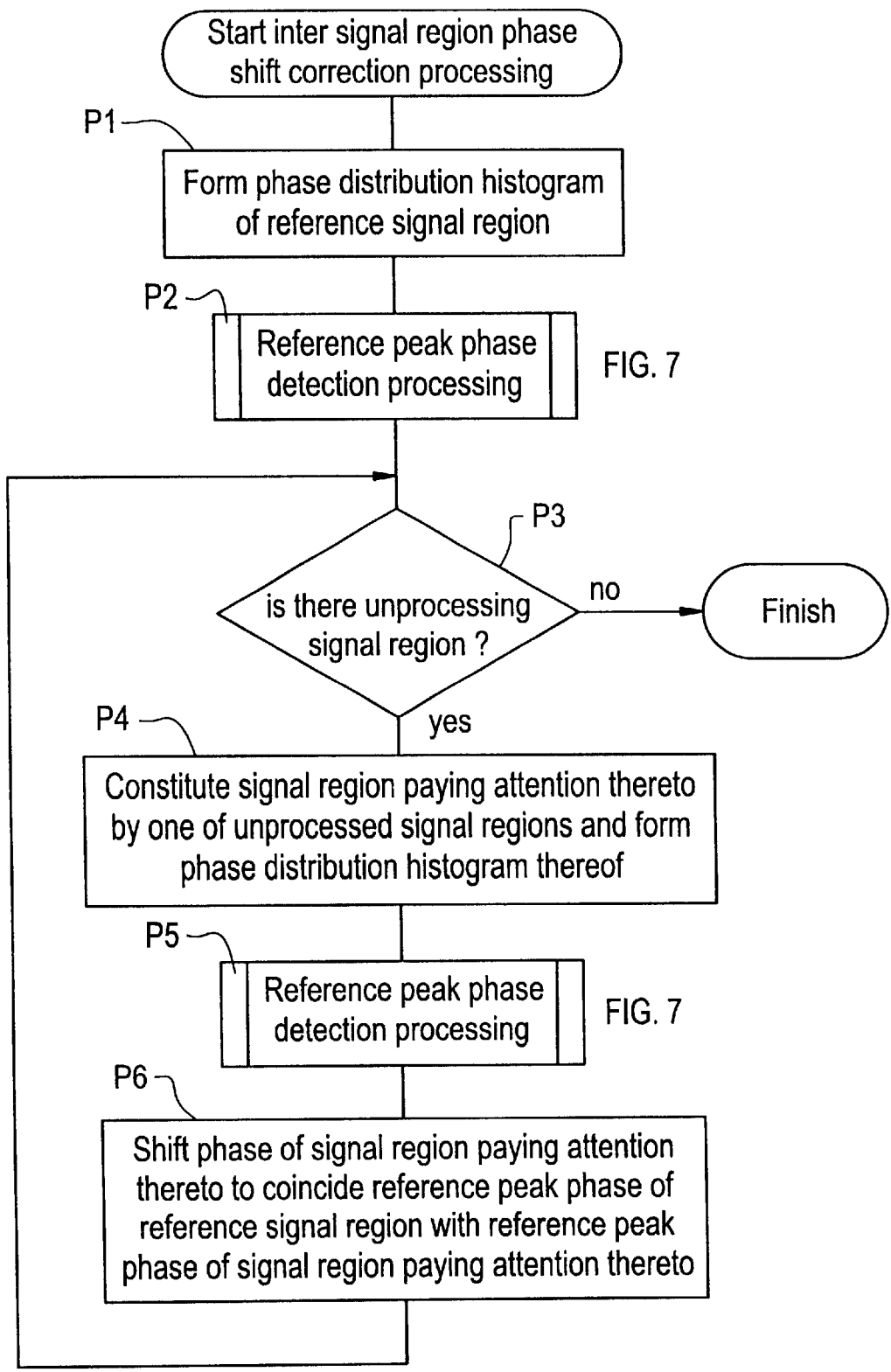
FIG. 6 is a flowchart showing a processing of correcting phase shifts among signal regions by the magnetic resonance imaging apparatus of FIG. 4.

FIG. 6 is a flowchart showing the processing of correcting the phase shifts among the signal regions by the magnetic resonance imaging apparatus 100. Further, for convenience of explanation, an explanation will be given by assuming the signal regions S1, S2 and S3 of FIG. 9.

Figure 11:
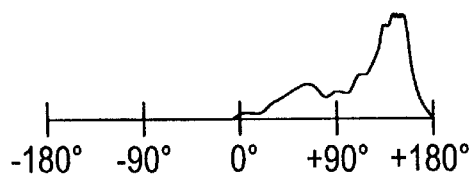
FIG. 11 is a diagram exemplifying a phase distribution histogram of a reference signal region.

At step P1, the signal region S1 is selected as a reference signal region from the signal regions S1, S2 and S3 and a phase distribution histogram of the reference signal region S1 is formed. FIG. 11 exemplifies a phase distribution histogram of the signal region S1. In the phase distribution histogram, the abscissa designates phase and the ordinate designates a pixel number. It cannot easily be determined where a peak of water and a peak of fat are present from the phase distribution histogram of FIG. 11.

Figure 3:
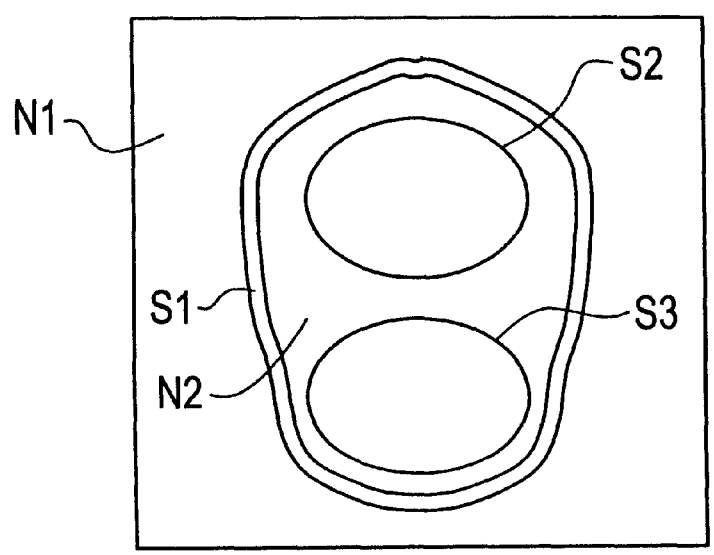
FIG. 3 is a view exemplifying a complex number image having a plurality of signal regions.
Figure 12:
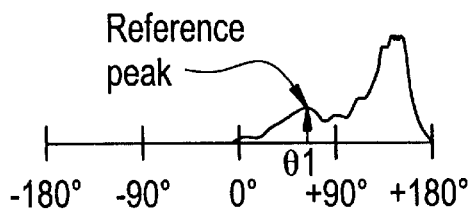
FIG. 12 is a diagram exemplifying a reference peak in the phase distribution histogram of the reference signal region.

Referring back to FIG. 3, at step P2, by a reference peak phase detection processing, as shown by FIG. 12, a phase θ1 of a reference peak in the reference signal region S1 is detected.

Further, a detailed explanation will be given later of the reference peak phase detection processing in reference to FIG. 7.

At step P3, steps P4 through P6 are repeated with respect to other signal regions and the processing is finished when there is not present an unprocessed signal region.

At step P4, one signal region is selected as a signal region to which attention is paid from unprocessed signal regions and a phase distribution histogram of the signal region to which attention is paid is formed.

Figure 13:
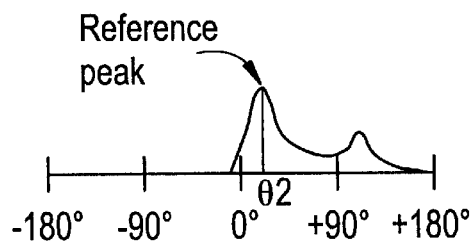
FIG. 13 is a diagram exemplifying a reference peak in a phase distribution histogram of other signal region.
Figure 14:
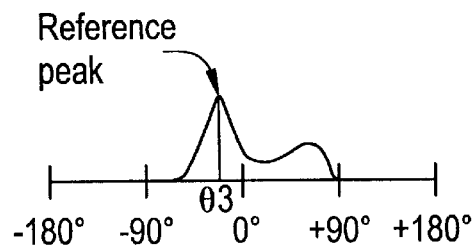
FIG. 14 is a diagram exemplifying a reference peak in a phase distribution histogram of still other signal region.

At step P5, by the reference peak detection processing, a phase of a reference peak of the signal region to which attention is paid is detected. At this step, as shown by FIG. 13 and FIG. 14, a phase θ2 of a reference peak in the signal region S2 and a phase θ3 of a reference peak in the signal region S3 are detected.

Further, the reference peak phase detection processing is similar to that in step P2.

Figure 15:
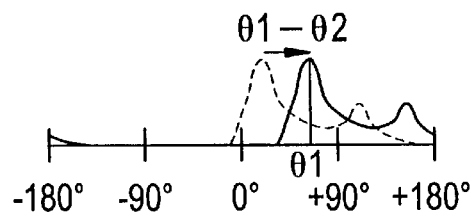
FIG. 15 is a diagram of a phase distribution histogram after phase shift correction of the other signal region.
Figure 16:
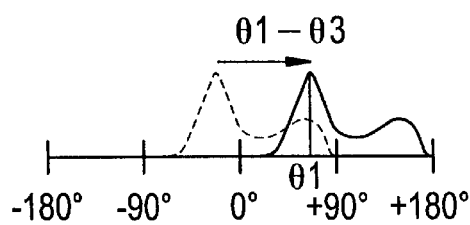
FIG. 16 is a diagram exemplifying a phase distribution histogram after phase shift correction of the still other signal region.

At step P6, as shown by FIG. 15 and FIG. 16, the phases of the signal regions to which attention is paid (S2, S3) are shifted such that the reference peak phase θ1 of the reference region signal S1 coincides with the reference peak phases (θ2, θ3) of the signal regions to which attention is paid (S2, S3). Further, the operation returns to step P3.

By the above-described, even among the respective signal regions S1, S2 and S3, phase of water can be aligned (in this case, aligned to θ1), further, phase of fat can also be aligned (in this case, aligned to θ1+α).

Figure 7:
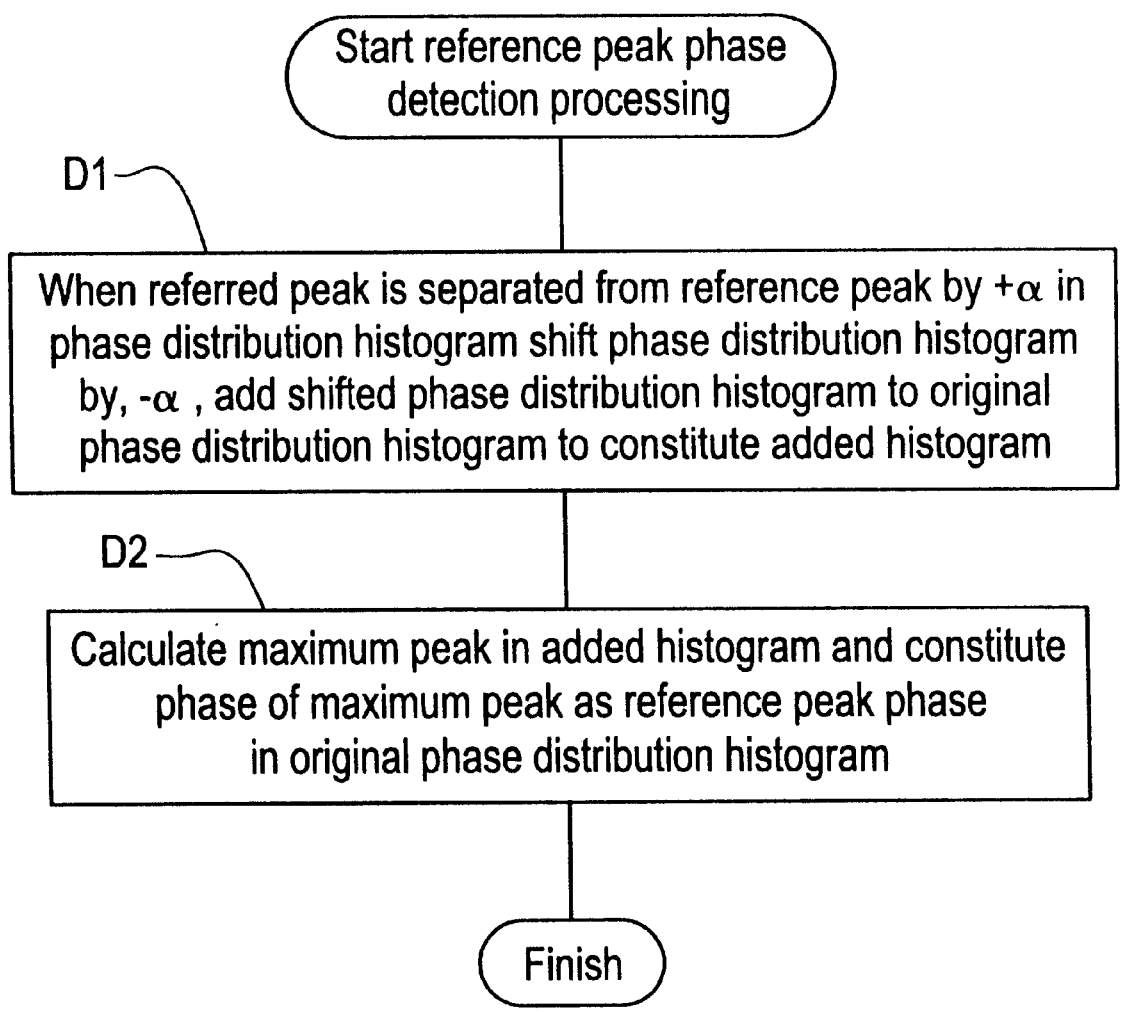
FIG. 7 is a flowchart showing a reference peak phase detection processing by the magnetic resonance imaging apparatus of FIG. 4.

FIG. 7 is a flowchart showing the reference peak detection processing by the magnetic resonance imaging apparatus 100. Further, for convenience of explanation, an explanation will be given by assuming the signal region S1 of FIG. 9.

Figure 17:
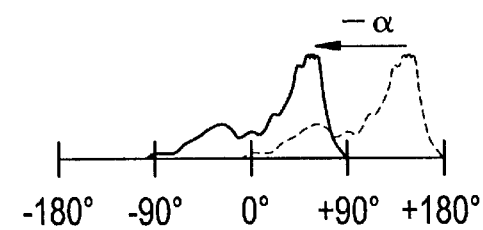
FIG. 17 is a diagram exemplifying a phase distribution histogram which is shifted inversely.
Figure 18:
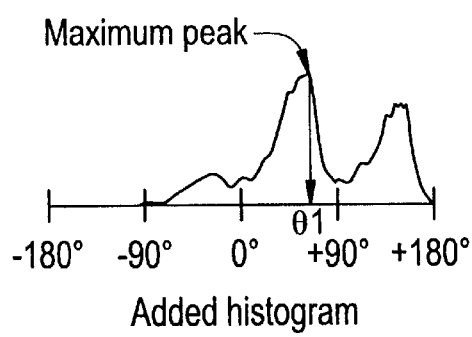
FIG. 18 is a diagram exemplifying an added histogram.

At step D1, when a referred peak (in this case, peak in correspondence with fat) is separated from a reference peak (in this case, peak in correspondence with water) in a phase distribution histogram by +α, as shown in FIG. 17, the phase distribution histogram is shifted by −α, and the shifted phase distribution histogram is added to an original phase distribution histogram to thereby constitute an added histogram as shown by FIG. 18.

At step D2, a maximum peak of the added histogram is calculated and a phase θ1 thereof is made to constitute a reference peak phase in the original phase distribution histogram. Further, the processing is finished.

By the above-described, the reference peak phase can easily be detected.

Many widely different embodiments of the invention may be configured without departing from the spirit and the scope of the present invention. It should be understood that the present invention is not limited to the specific embodiments described in the specification, except as defined in the appended claims.

What is claimed is:

1. A method of forming a water and fat separation image comprising the steps of:
    forming a complex number image utilizing magnetic resonance to provide a phase difference between water and fat;
    partitioning said complex number image into a plurality of signal regions and noise regions;
    correcting a phase error caused by non-uniformity of magnetic field for each said signal region;
    correcting phase shifts among a plurality of signal regions to thereby align at least one of either phases of water or phases of fat; and
    forming separate water image and fat image by utilizing phase differences between fat and water from the complex number image subjected to the phase shift correction.

2. The method of claim 1, wherein said step of correcting phase shifts comprises the steps of:
    detecting reference peak phases with respect to distributions of pixel numbers with regard to phases of respective signal regions subjected to phase correction; and
    shifting distributions of said pixel numbers with regard to phases of respective signal regions so that the reference peak phases coincide with each other.

3. A magnetic resonance imaging apparatus comprising:
    means for forming a complex number image utilizing magnetic resonance to provide a phase difference between water and fat;
    means for partitioning said complex number image into a plurality of signal regions and noise regions;
    means for correcting a phase error caused by non-uniformity of magnetic field for each said signal region;
    means for correcting phase shifts among a plurality of signal regions to thereby align at least one of either phases of water or phases of fat; and
    means for forming separate image and fat image by utilizing phase differences between fat and water from the complex number image subjected to the phase shift correction.

4. The apparatus of claim 3, wherein said means for correcting phase shifts comprises:
    means for detecting reference peak phases with respect to distributions of pixel numbers with regard to phases of respective signal regions subjected to phase correction; and
    means for shifting distributions of said pixel numbers with regard to phases of respective signal regions so that the reference peak phases coincide with each other.

5. A magnetic resonance imaging apparatus comprising:
    imaging means for imaging an image of a complex number by using magnetic resonance so that phase difference between water and fat is not Π;
    phase correction means for correcting phase in a plurality of signal areas, respectively, when there are in said image of a complex number said plurality of signal areas which are not connected to one another;
    phase shift correction means for correcting phase shifts which are shifts of phases in any two of said plurality of signal areas where phases were corrected by said phase correction means; and
    image producing means for producing a water image and a fat image, respectively, by using phase difference between water and fat in said image of a complex number where said phase shifts were corrected by said phase shift correction means.

6. The apparatus of claim 5, further comprising:
    means for determining threshold values of a signal area and of a noise area in said image of a complex number;
    means for repeatedly judging whether next four points belong to a signal area or not by comparing a pixel value with said threshold value of said signal area, a point in said signal area being a starting point;
    means for repeatedly judging whether next four points belong to a noise area, a point in said noise area being a starting point; and
    means for separating said signal area and said noise area in said image of a complex number.

7. The apparatus of claim 5, wherein said phase correction means comprises means for correcting a phase error which is caused by non-uniformity of static magnetic field.

8. The apparatus of claim 6, wherein said phase correction means comprises means for correcting a phase error which is caused by non-uniformity of static magnetic field.

9. The apparatus of claim 5, wherein said phase correction means comprises:
   phase distribution producing means for producing a distribution of pixel number corresponding to each phase in each said signal area where phase was corrected;
   standard peak phase judging means for searching in each said phase distribution phase where said pixel number is a maximum and for judging said search phase standard peak phase in said phase distribution; and
   phase distribution shifting means for shifting said phase distribution in each said signal area so as to become same as said standard peak phase.

10. The apparatus of claim 6, wherein said phase correction means comprises:
    phase distribution producing means for producing a distribution of pixel number corresponding to each phase in each said signal area where phase was corrected;
    standard peak phase judging means for searching in each said phase distribution phase where pixel number is a maximum and for judging said search phase standard peak phase in said phase distribution; and
    phase distribution shifting means for shifting said phase distribution in each said signal area so as to become same as said standard peak phase.

11. The apparatus of claim 7, wherein said phase correction means comprises:
    phase distribution producing means for producing a distribution of pixel number corresponding to each phase in each said signal area where phase was corrected;
    standard peak phase judging means for searching in each said phase distribution phase where pixel number is a maximum and for judging said search phase standard peak phase in said phase distribution; and
    phase distribution shifting means for shifting said phase distribution in each said signal area so as to become same as said standard peak phase.

12. The apparatus of claim 8, wherein said phase correction means comprises:
    phase distribution producing means for producing a distribution of pixel number corresponding to each phase in each said signal area where phase was corrected;
    standard peak phase judging means for searching in each said phase distribution phase where pixel number is a maximum and for judging said search phase standard peak phase in said phase distribution; and
    phase distribution shifting means for shifting said phase distribution in each said signal area so as to become same as said standard peak phase.

13. The apparatus of claim 9, further comprising:
    addition phase distribution producing means for producing addition phase distributions, respectively, by shifting conversely each said phase distribution which was produced by said phase distribution producing means, quantity of said shifting being said phase difference; and wherein
    said standard peak phase judging means comprises: means for searching in each said addition phase distribution phase where pixel number is a maximum, and means for judging said searched phase standard peak phase in an original phase distribution.

14. The apparatus of claim 10, further comprising:
    addition phase distribution producing means for producing addition phase distribution, respectively, by shifting conversely each said phase distribution which was produced by said phase distribution producing means, quantity of said shifting being said phase difference; and wherein
    said standard peak phase judging means comprises: means for searching in each said addition phase distribution phase where pixel number is a maximum, and means for judging said searched phase standard peak phase in an original phase distribution.

15. The apparatus of claim 11, further comprising:
    addition phase distribution producing means for producing addition phase distributions, respectively, by shifting conversely each said phase distribution which was produced by said phase distribution producing means, quantity of said shifting being said phase difference; and wherein
    said standard peak phase judging means comprises: means for searching in each said addition phase distribution phase where pixel number is a maximum, and means for judging said searched phase standard peak phase in an original phase distribution.

16. The apparatus of claim 12, further comprising:
    addition phase distribution producing means for producing addition phase distributions, respectively, by shifting conversely each said phase distribution which was produced by said phase distribution producing means, quantity of said shifting being said phase difference; and wherein
    said standard peak phase judging means comprises: means for searching in each said addition phase distribution phase where pixel number is a maximum, and means for judging said searched phase standard peak phase in an original phase distribution.

* * * * *